US006350998B1

(12) United States Patent
Tsuji

(10) Patent No.: US 6,350,998 B1
(45) Date of Patent: Feb. 26, 2002

(54) ULTRASPEED LOW-VOLTAGE DRIVE AVALANCHE MULTIPLICATION TYPE SEMICONDUCTOR PHOTODETECTOR

(75) Inventor: Masayoshi Tsuji, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/335,601

(22) Filed: Jun. 18, 1999

(30) Foreign Application Priority Data

Jun. 24, 1998 (JP) .......................................... 10-177289

(51) Int. Cl.$^7$ ............................................. H01L 31/107
(52) U.S. Cl. ......................... 257/186; 257/185; 257/190
(58) Field of Search ................................ 257/184–191, 257/431–438

(56) References Cited

U.S. PATENT DOCUMENTS

| 4,383,269 A | * | 5/1983 | Capasso |
| 4,597,004 A | * | 6/1986 | Longeway et al. |
| 5,233,209 A | * | 8/1993 | Rodgers et al. |
| 5,322,573 A | * | 6/1994 | Jain et al. |
| 5,432,361 A | * | 7/1995 | Taguchi |
| 5,543,629 A | * | 8/1996 | Nakamura et al. ............ 257/21 |
| 6,075,253 A | * | 6/2000 | Sugiyama et al. |

FOREIGN PATENT DOCUMENTS

| JP | 1-162382 | 6/1989 |
| JP | 2-10780 | 1/1990 |
| JP | 3-248481 | 11/1991 |
| JP | 3-270277 | 12/1991 |
| JP | 5-75160 | 3/1993 |
| JP | 5-145109 | 6/1993 |
| JP | 5-291609 | 11/1993 |
| JP | 6-291359 | 10/1994 |

OTHER PUBLICATIONS

Tsuji et al., "InALGaAs impact ionization rates in bulk, superlattice, and sawtooth band structures," Applied Physics Letters, Dec. 19, 1994, vol. 65, No. 25, p. 3248–3250.*

Madelung, "Semiconductors—Basic Data," 1996, Springer–Verlag, 2nd edition, p. 151 and 159.*

Yonedu, "Hikari Tushin Soshi Kogaku" (Optical Communications Device Engineering), Kougaku Tosho Co., Ltd., 371 (1983).*

Tsuji, M. et al., "InALGas impact ionization rates in bulk, superlattice, and sawtooth band structures", Appl. Phys. Lett. 65 (25), Dec. 19, 1994, American Institute of Physics, pp. 3248–3250.

Sugimoto, Y. et al., "High–Speed Planar–Structure InP/InGaAsP/InGaAs Avalanche Photoddiode Grown by VPE", Electronics Letters, Aug. 2, 1984, vol. 20, No. 16, pp. 653–354.

Watanabe, I. et al., "High–Speed and Low–Dark–Current Flip–Chip InALAs/InALGaAs Quaternary Well Sperlattice APD's with 120 GHz Gain–Bandwidth Product", IEEE Photonics Technology Letters, vol. 5, No. 6, Jun. 1993, pp. 675–677.

Capasso, F. et al., "The graded bandgap avalanche diode: a new molecular beam epitaxial structure with a large ionization rate ratio", The Institute of Physics, 1982, Inst. Phys. Conf. Ser. No. 63: Chapter 10, Japan.

* cited by examiner

Primary Examiner—Fetsum Abraham
Assistant Examiner—Kevin Quinto
(74) Attorney, Agent, or Firm—Hutchins, Wheeler & Dittmar

(57) ABSTRACT

In an avalanche photodiode having a separated electron injection type light absorbing layer/multiplication layer structure, the multiplication layer comprises $In_{(1-x-y)}Al_xGa_yAs$ with the composition thereof being graded from InAlAs on the light absorbing layer side to InGaAs and preferably has a thickness of not more than 0.1 μm. By virtue of the above construction, very low noise characteristics and ultraspeed characteristics can be attained in photodetectors at 1 μm wavelength for long distance optional communications.

9 Claims, 7 Drawing Sheets

WHERE NO ELECTRIC FIELD IS APPLIED

WHERE ELECTRIC FIELD IS APPLIED

WHERE NO ELECTRIC FIELD IS APPLIED

WHERE ELECTRIC FIELD IS APPLIED

ULTRASPEED LOW-VOLTAGE DRIVE AVALANCHE MULTIPLICATION TYPE SEMICONDUCTOR PHOTODETECTOR

FIELD OF THE INVENTION

The invention relates to a semiconductor photodetector for optical communications, optical information processing, optical measurement and the like, and more particularly to an ultraspeed, low-voltage drive avalanche multiplication type semiconductor photodetector.

BACKGROUND OF THE INVENTION

PIN type semiconductor photodetectors comprising a light absorbing layer of $In_{0.53}Ga_{0.47}As$ (hereinafter referred to as "InGaAs layer") provided in a lattice matched form onto an InP substrate (Yonedu, "HIKARI TUSHIN SOSHI KOGAKU (OPTICAL COMMUNICATIONS DEVICE ENGINEERING)," Kougaku Tosho Co., Ltd., 371 (1983)) and avalanche multiplication type semiconductor photodetectors, Electronics Letters, Vol. 20, 653–654 (1984) are known as conventional semiconductor photodetectors for optical communications in a 1 to 1.6 μm wavelength range. In particular, by virtue of internal gain effect and high-speed response derived from avalanche multiplication, the latter has been put to practical use for long distance communications.

A typical InGaAs-APD (the avalanche multiplication type semiconductor photodetector being hereinafter often referred to as "APD") will be explained. The InGaAs-APD is operated as follows. Among photocarriers generated in the InGaAs light absorbing layer, holes are injected by the electric field into the InP avalanche multiplication layer. Since a high electric field is applied to the avalanche layer, the holes are accelerated and give rise to impact ionization. Noise characteristics and high-speed characteristics important for the characteristics of APD are governed by random ionization process of carriers in the course of multiplication. More specifically, a higher ratio of the ionization coefficient of electrons and the ionization coefficient of holes in the multiplication layer leads to expectation of lower noise characteristics. Further, the time taken for providing a predetermined multiplication factor can be shortened with increasing the ionization coefficient ratio, and in this case, high-speed characteristics can also be attained. Electron ionization coefficient a may be larger than hole ionization coefficient β, or vice versa. A larger ratio $\alpha/\beta$ (or $\beta/\alpha$) offers better results.

The ionization coefficient ratio, however, is inherent in materials, and, in the case of InP as the multiplication layer in the InGaAs-APD, is about 2 at the highest in terms of $\beta/\alpha$. On the other hand, in the case of Si-APD used at 0.8 μm wavelength, the ionization coefficient ($\alpha/\beta$) of the Si multiplication layer is as large as about 20 to 50, and hence can offer satisfactory low noise characteristics. For this reason, development of APDs having a high ionization coefficient ratio even in a long wavelength range, i.e., a 1 to 1.6 μm wavelength range, has been desired in the art.

On the other hand, in recent years, research reports have been made on superlattice APDs and staircase APDs having a superlattice structure and a multilayered structure with a graded composition in the multiplication layer. These APDs have been prepared with a view to accelerating the impact ionization of electrons using conduction band discontinuous energy and increasing the ionization coefficient ratio. The gain bandwidth product for superlattice APDs using an InAlAs/InAlGaAs superlattice layer as the multiplication layer has been reported to be 120 GHz which is on a level high enough for practical use of the APDs (IEEE Photonics Technology Letters, Vol. 5, 675–677 (1993)). Further, for staircase APDs using, as the multiplication layer, a multi-layered structure with the composition thereof being graded from InAlAs to InAlGaAs, an ionization coefficient ratio exceeding the superlattice APDs has been reported (Appl. Phys. Letters, Vol. 65, 3248–3250 (1994)).

On the other hand, a plurality of proposals have been made for increasing the ionization coefficient ratio on a principle different from the above principle. One of them is a graded gap APD (for example, Int. Symp. GaAs and Related Compounds, Japan, 473–478 (1981)). In this APD, a multiplication layer with the band gap energy being continuously graded is used to travel electrons from the wide gap side to the narrow gap side. The impact ionization is known from experience to occur when the carrier has obtained energy in an amount of at least 1.5 times the band gap. Therefore, electrons being traveled toward the narrow gap side are likely to cause impact ionization. On the other hand, holes are traveled toward the wide gap side, and hence is less likely to cause impact ionization. This leads to expectation of an improvement in ionization coefficient ratio. Here the graded band refers to the presence of internal pseudo-electric field. Therefore, energy in a larger amount than the externally applied electric field is given to the electrons. In this research report, a device having a 0.7 μm-thick multiplication layer of $Al_xGa_{1-x}As$ is compared with a 0.4 μm-thick multiplication layer of $Al_xGa_{1-x}As$ to demonstrate that the latter has a larger ionization coefficient ratio. Theoretically, since the internal electric field effect of the conduction band is increased, the multiplication factor of electrons must be increased. According to experimental results, however, there is no significant change in multiplication factor of electrons, and the multiplication factor of holes is suppressed, resulting in increased ionization coefficient ratio. There are no experimental reports on such APDs.

As described above, an attempt to improve the ionization coefficient ratio has been made on APDs at long wavelengths. As described in the above report, superlattice APDs and staircase APDs capable of coping with a frequency band of 10 Gb/s could have been realized. In these devices, however, the operation voltage is not less than 20 V, and the suppression of ionization coefficient ratio by the application of high electric field occurs. Consequently, the ionization coefficient ratio is about 3 to 6 at the highest.

SUMMARY OF THE INVENTION

Under the above circumstances, the invention has been made, and it is an object of the invention to provide an avalanche multiplication type semiconductor photodetector that can simultaneously realize low-voltage operation and high ionization coefficient ratio.

According to the first feature of the invention, a avalanche multiplication type semiconductor photodetector comprises: a semiconductor substrate; and at least a light absorbing layer and a multiplication layer provided on said semiconductor substrate, the light absorbing layer comprising InGaAs, the multiplication layer comprising $In_{(1-x-y)}Al_xGa_yAs$ with the composition thereof being graded so that the energy band is continuously decreased from the light absorbing layer side toward the multiplication layer in its side remote from the light absorbing layer.

In the semiconductor photodetector according to the first feature of the invention, adoption as the multiplication layer of $In_{(1-x-y)}Al_xGa_yAs$ with the composition thereof being graded permits an electric field exceeding 50 kV/cm to be added to electrons, and occurrence of ionization of electrons in the narrow gap is likely to cause impact ionization. On the other hand, bringing an effective electric field applied to holes to not more than about 200 kV/cm prevents impact ionization of holes. This renders the ionization coefficient ratio close to infinity, so that very low noise characteristics can be realized.

In the semiconductor photodetector, the thickness of the multiplication layer is preferably not more than 0.1 μm.

Preferably, the composition of the multiplication layer is graded from InAlAs to InGaAs.

According to a preferred embodiment of the invention, an electric field relaxation layer of $In_{(1-x-y)}Al_xGa_yAs$ is interposed between the light absorbing layer and the multiplication layer.

Preferably, the composition of the electric field relaxation layer is graded from InGaAs on the light absorbing layer side to InAlAs on the multiplication layer side so as to continuously increase the energy band.

In the semiconductor photodetector having the electric field relaxation layer, preferably, the light absorbing layer is of p-conductive type, the electric field relaxation layer is of p-conductive type, and the multiplication layer is n-conductive type or a high-resistance layer (i-conductive type).

Alternatively, all the light absorbing layer, the electric field relaxation layer, and the multiplication layer may be of n-conductive type or a high-resistance layer (i-conductive type)

BRIEF DESCRIPTION OF THE DRAWING

The invention will be explained in more detail in conjunction with the appended drawings, wherein.

DESCRIPTION OF THE PREFERRED EMBODIMENTS

Before describing the semiconductor photodetector according to preferred embodiments of the invention, the conventional semiconductor photodetector will be explained in conjunction with FIG. 1.

Figure 1:
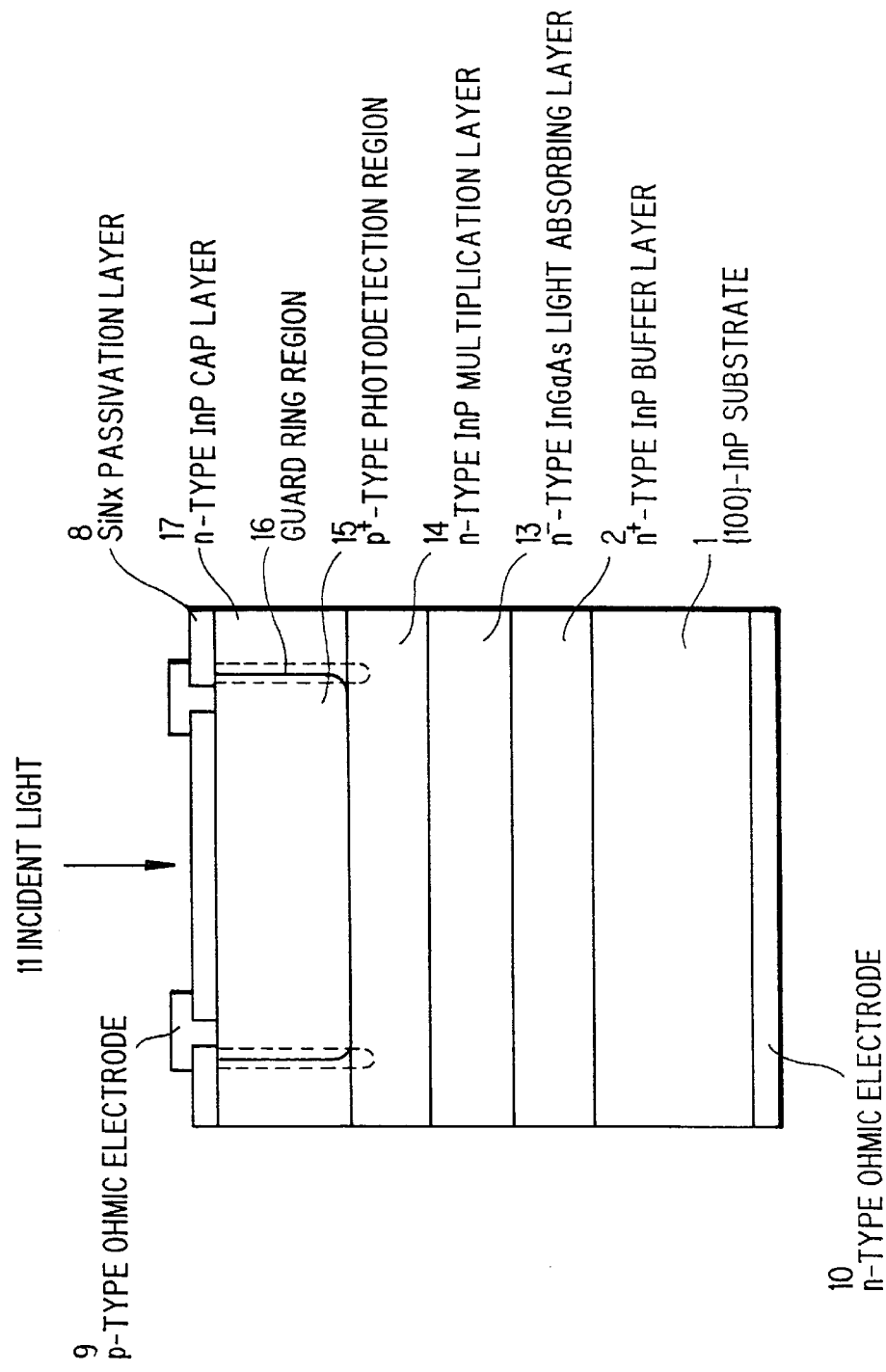
FIG. 1 is a diagram showing the structure of a conventional InGaAs APD.

A typical conventional InGaAs-APD is shown in FIG. 1. This InGaAs-APD comprises: an Inp substrate 1; an n-type ohmic electrode 10 provided on one side of the InP substrate 1; and an $n^+$-type InP buffer layer 2, an $n^-$-type InGaAs light absorbing layer 13, and an n-type InP multiplication layer 14 provided in that order on the InP substrate 1 in its side remote from the n-type ohmic electrode 10. A $p^+$-type photodetection region 15, a guard ring region 16, and an n-type InP cap layer 17 are provided on the n-type InP multiplication layer 14. Further, an SiNx passivation layer 8 and a p-type ohmic electrode 9 are provided thereon. The operation of this InGaAs-APD will be explained. Incident light 11 enters in a direction indicated by an arrow. Among photocarriers generated in the InGaAs light absorbing layer 13, holes are injected by the electric field into the InP avalanche multiplication layer 14. Since a high electric field is applied to the avalanche layer, the holes are accelerated and give rise to impact ionization. Noise characteristics and high-speed characteristics important for the characteristics of APD are governed by random ionization process of carriers in the course of multiplication. More specifically, a higher ratio of the ionization coefficient of electrons and the ionization coefficient of holes in the multiplication layer leads to expectation of lower noise characteristics. Further, the time taken for providing a predetermined multiplication factor can be shortened with increasing the ionization coefficient ratio, and in this case, high-speed characteristics can also be attained. Electron ionization coefficient α may be larger than hole ionization coefficient β, or vice versa. A larger ratio α/β (or β/α) offers better results.

The ionization coefficient ratio, however, is inherent in materials, and, in the case of InP as the multiplication layer in the InGaAs-APD, is about 2 at the highest in terms of β/α. On the other hand, in the case of Si-APD used at 0.8 μm wavelength, the ionization coefficient ratio (α/β) of the Si multiplication layer is as large as about 20 to 50, and hence can offer satisfactory low noise characteristics. For this reason, development of APDs having a high ionization coefficient ratio even in a long wavelength range, that is, a 1 to 1.6 μm wavelength range, has been desired in the art.

The semiconductor photodetectors according to the preferred embodiments of the invention will be explained in conjunction with FIGS. 2 to 7.

Figure 2A:
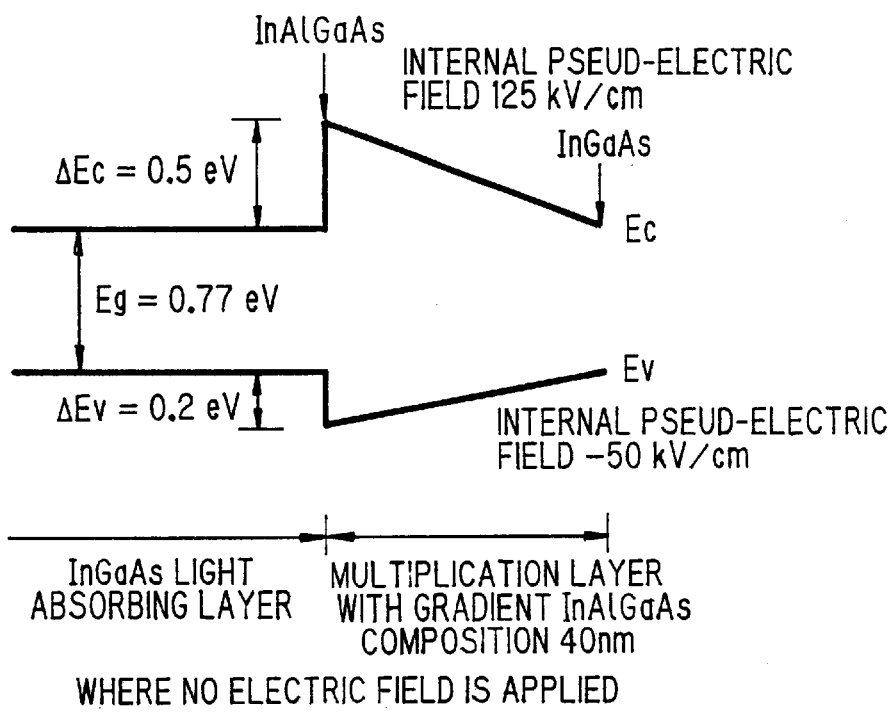
FIGS. 2A and 2B are diagrams illustrating the function of a preferred embodiment of the invention.
Figure 2B:
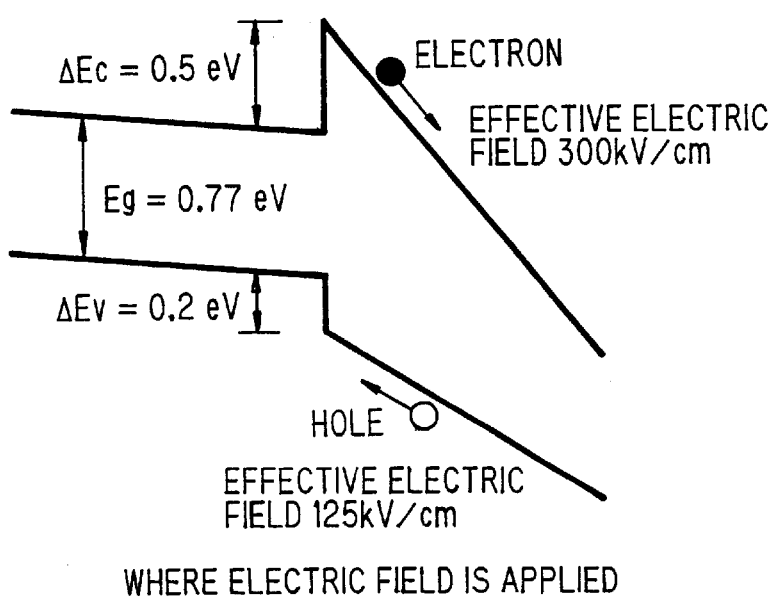

FIG. 2 is a diagram showing a band structure for explaining APD according to a preferred embodiment of the invention, wherein FIG. 2A represents a band structure where no electric field is applied and FIG. 2B a band structure where an electric field is applied. As is apparent from FIGS. 2A and 2B, the device structure is such that a narrow gap InGaAs light absorbing layer is contiguous to a multiplication layer with the composition thereof being graded from InAlAs to InGaAs. When the width of the multiplication layer having a graded composition is 40 nm, the conduction band discontinuous energy between the light absorbing layer and the multiplication layer is 0.5 eV. Therefore, the grading of the band in the conduction band has an internal electric field of 125 kV/cm and acts so as to accelerate electrons. On the other hand, since the discontinuous energy in the valence electron band is 0.2 eV, the grading of the band permits a field strength of 50 kV/cm to be added so as to decelerate holes. Next, operation in the case where an electric field is applied will be discussed (FIG. 2B). For example, when an external voltage of 0.7 V is entirely applied to the multiplication layer, the effective field strength applied to electrons in the conduction band is 300 kV/cm because the effect attained by the grading of the band is added. On the other hand, the effective electric field applied to holes in the valence electron band is as low as 125 kV/cm.

In this case, according to the invention, grading of the composition of the multiplication layer from InAlAs to InGaAs and the small thickness (not more than 0.1 μm) of the multiplication layer having the graded composition can offer significant effect. At the outset, the effect attained by the graded composition of the multiplication layer will be explained. Electrons injected into the multiplication layer are traveled from the InAlAs layer side toward the InGaAs layer side. In the course of travelling, electrons obtain energy proportional to the effective field strength, leading to impact ionization. In fact, since the multiplication layer width is narrow, multiplication occurs at the end of the multiplication layer, that is, around InGaAs.

The ionization coefficient of InGaAs is known to have a relatively large electron ionization coefficient even at a field strength of 200 kV/cm (see, for example, OPTICAL COMMUNICATIONS DEVICE ENGINERING p. 389, noted above). According to the semiconductor photodetector of the invention, a field strength of 300 kV/cm can be added to electrons by applying an external electric field of only 0.7 V. On the other hand, holes generated by impact ionization of electrons are traveled from the InGaAs side toward the InAlAs side. However, the effective field strength, where an external electric field of 0.7 V is applied, is as low as 125 kV/cm. Further, holes are traveled toward InAlAs on the wide gap side. Since, however, the ionization coefficient is suppressed in the wide gap material. Consequently, holes cannot cause impact ionization. That is, the effect attained by the multiplication layer having a graded composition and the effect attained by the structure with the composition thereof being graded from InAlAs to InGaAs permit only electrons to cause impact ionization. This can realize an ionization coefficient ratio close to infinity.

Next, the effect attained by the multiplication layer width not more than 0.1 μm will be explained. According to conventional APDs, impact ionization occurs in the multiplication layer in a random manner without dependency upon places. By contrast, in the APD according to the preferred embodiment of the invention, since the multiplication layer width is narrow, impact ionization occurs in a limited place, that is, around InGaAs in the multiplication layer having a graded composition. In order to effectively develop this phenomenon, in the above structure, the multiplication layer width for providing an internal pseudo-electric field of not less than 50 kV/cm is limited to not more than 0.1 μm. As a result, a fluctuation in impact ionization according to places is reduced. This can provide an excess noise factor F close to 1 which exceeds the best excess noise factor of the conventional APDs F=2. Further, the action of the multiplication layer having a graded composition and the narrow multiplication layer width in a synergistic fashion enables the generation of tunneling dark current at the time of electric field application to be suppressed even in InGaAs, in the multiplication layer, having the minimum band gap energy.

Here, problems involved in the conventional graded gap APD (for example, Int. Symp. GaAs and Related Compounds, Japan, 473–478 (1981)) noted above will be pointed pout. In this APD, the composition of the multiplication layer is graded from $Al_{0.45}Ga_{0.55}As$ to GaAs. Even for the APD having a minimum multiplication layer width described to be 0.3 μm, the internal pseudo-electric field in the conduction band is as low as about 16 kV/cm that has substantially no effect on the travel of electrons. Further, since the multiplication layer width is large, impact ionization occurs randomly without dependence upon places. Therefore, even though the infinite ionization coefficient ratio could be attained, the excess noise factor remains F=2. Further, the conventional APD has a problem associated with an improvement in ionization coefficient ratio. The minimum band gap energy in the multiplication layer is 1.42 eV for GaAs, indicating that the gap is relatively wide. Therefore, a high electric field is required for impact ionization. This substantially eliminates the effect of the internal electric field exerted by the graded composition. In addition, since holes also cause impact ionization upon application of a high electric field, a high ionization coefficient ratio cannot be provided.

Figure 3A:
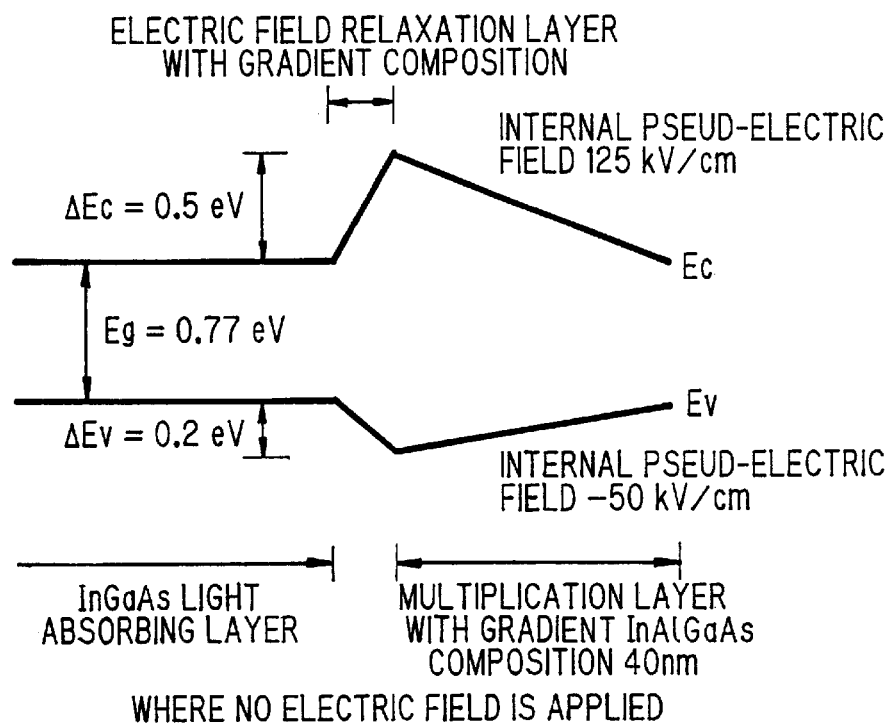
FIGS. 3A and 3B are diagrams illustrating the function of another preferred embodiment of the invention.
Figure 3B:
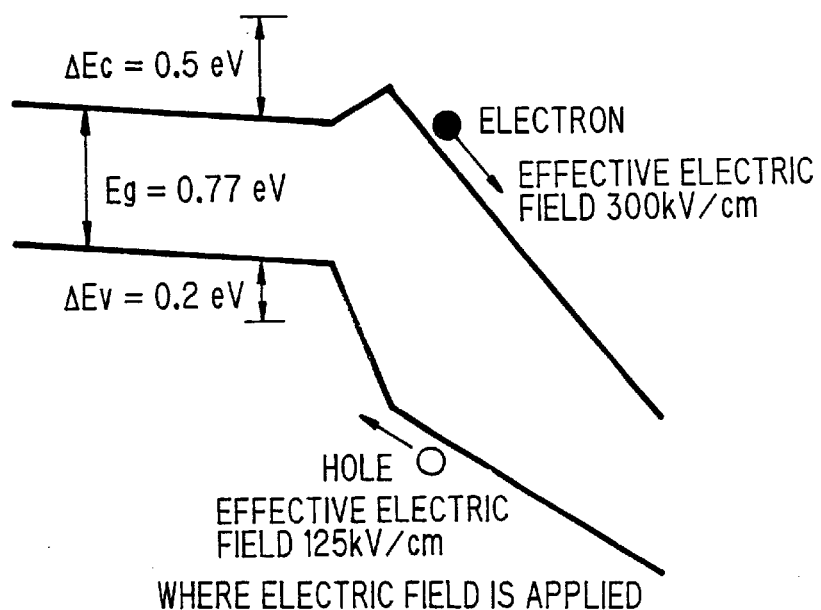

Next, another preferred embodiment of the invention will be explained in FIGS. 3A and 3B. FIG. 3A is a diagram of an energy band for the APD according to another preferred embodiment of the invention where no electric field is applied, and FIG. 3B a diagram of an energy band where an electric field is applied. This preferred embodiment is characterized in that an electric field relaxation layer is interposed between the InGaAs light absorbing layer and the multiplication layer of $In_{(1-x-y)}Al_xGa_yAs$ with the composition thereof being graded, the composition of the electric field relaxation layer being graded from InGaAs on the light absorbing layer side to InAlAs on the multiplication layer side.

The light absorbing layer is of p-conductive type, the electric field relaxation layer is of p-conductive type, and the multiplication layer is n-conductive type. The pn interface is the interface of the electric field relaxation layer and the multiplication layer, so that the highest electric field is applied to InAlAs. By virtue of the wide gap, the generation of tunneling dark current can be suppressed. A relatively high electric field is applied to the electric field relaxation layer on its multiplication layer side, that is, a region having a composition close to InAlAs. Since, however, in this material system, the ionization coefficient of electrons is larger than the ionization coefficient of holes, multiplication contamination (for example, use of an InP material lowers the α/β value in the multiplication layer due to large ionization coefficient of holes) in this region can be prevented. In addition, the electric field relaxation layer, as shown in FIG. 3B, does not serve as barriers, such as notches against the travel of electrons at the time of application of an electric field. Therefore, this structure can prevent energy loss of electrons.

By virtue of the above effects, electrons generated in the light absorbing layer, while being accelerated by the electric field applied to the light absorbing layer, is passed through the electric field relaxation layer and is then injected into the multiplication layer. The electrons can be led to the end of the wide gap InAlAs multiplication layer while substantially avoiding the energy loss in the course of the travel of electrons. Therefore, electrons injected into the multiplication layer already have some energy, and additional energy is given in the multiplication layer. This facilitates impact ionization.

Figure 4A:
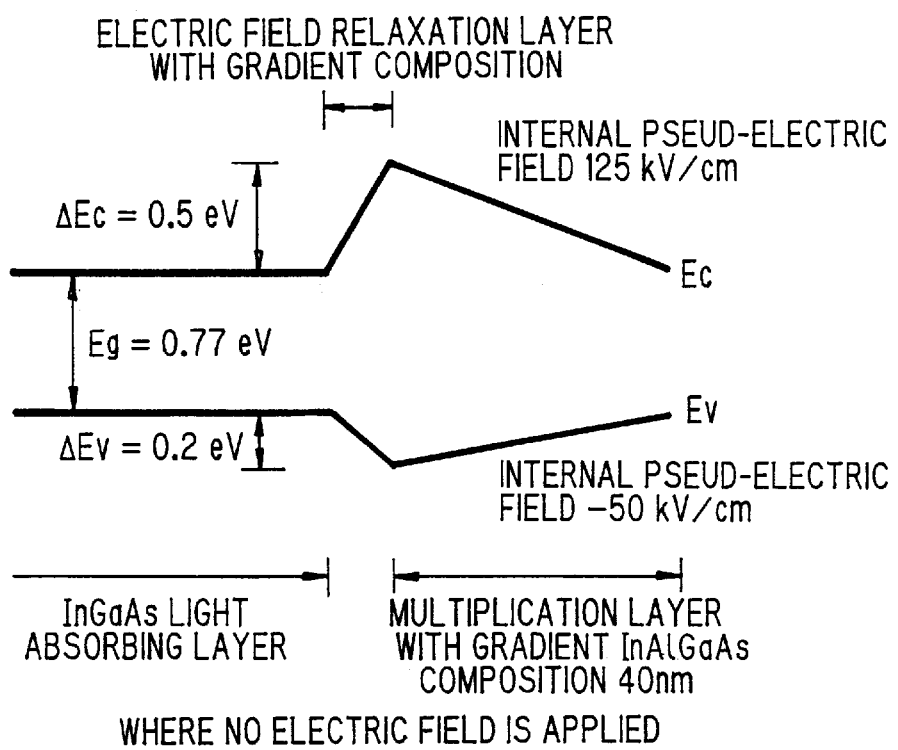
FIGS. 4A and 4B are diagrams illustrating the function of a further preferred embodiment of the invention.
Figure 4B:
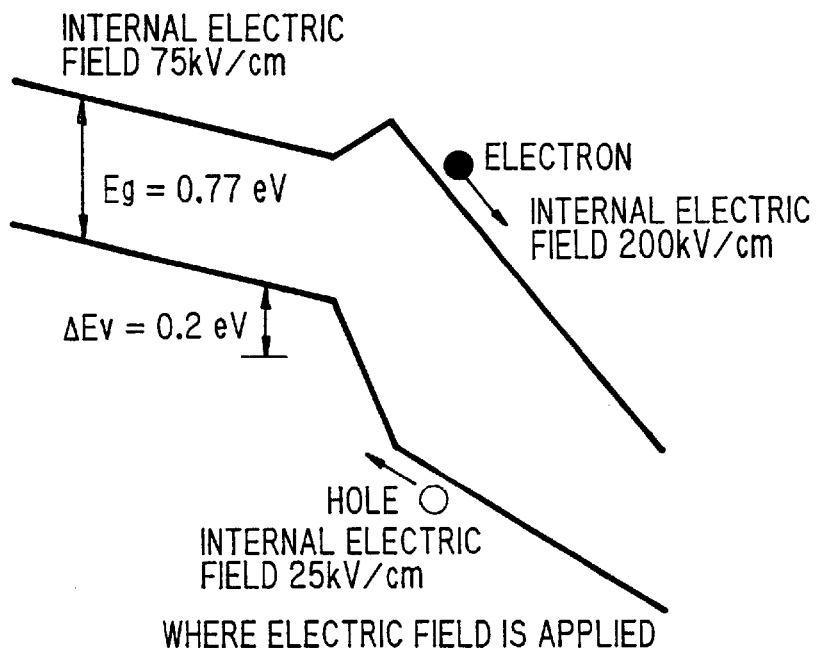

Next, a further preferred embodiment of the invention will be explained in FIGS. 4A and 4B. FIG. 4A shows an energy band structure of APD according to the further preferred embodiment of the invention where no electric field is applied, and FIG. 4B shows an energy band structure where an electric field is applied. This preferred embodiment is characterized in that all the light absorbing layer, the electric field relaxation layer having a graded composition, and the multiplication layer having a graded composition are of n-conductive type (or i-conductive type). In this case, a depletion layer extends from the light absorbing layer side. The light absorbing layer is an InGaAs narrow gap layer, and, hence, the field strength applicable to the light absorbing layer is as low as about 150 kV/cm. Since, however, an internal electric field exists in the multiplication layer by virtue of the effect of the graded composition, the internal field strength in the conduction band reaches 275 kV/cm. FIG. 4B is an energy band structure where an external electric field of 75 kV/cm is applied. In this case, impact ionization of electrons only is possible. Also in this APD construction, very low noise characteristics can be achieved. A particular advantage of this APD construction resides in the simplest structure, that is, a PIN structure.

Figure 5:
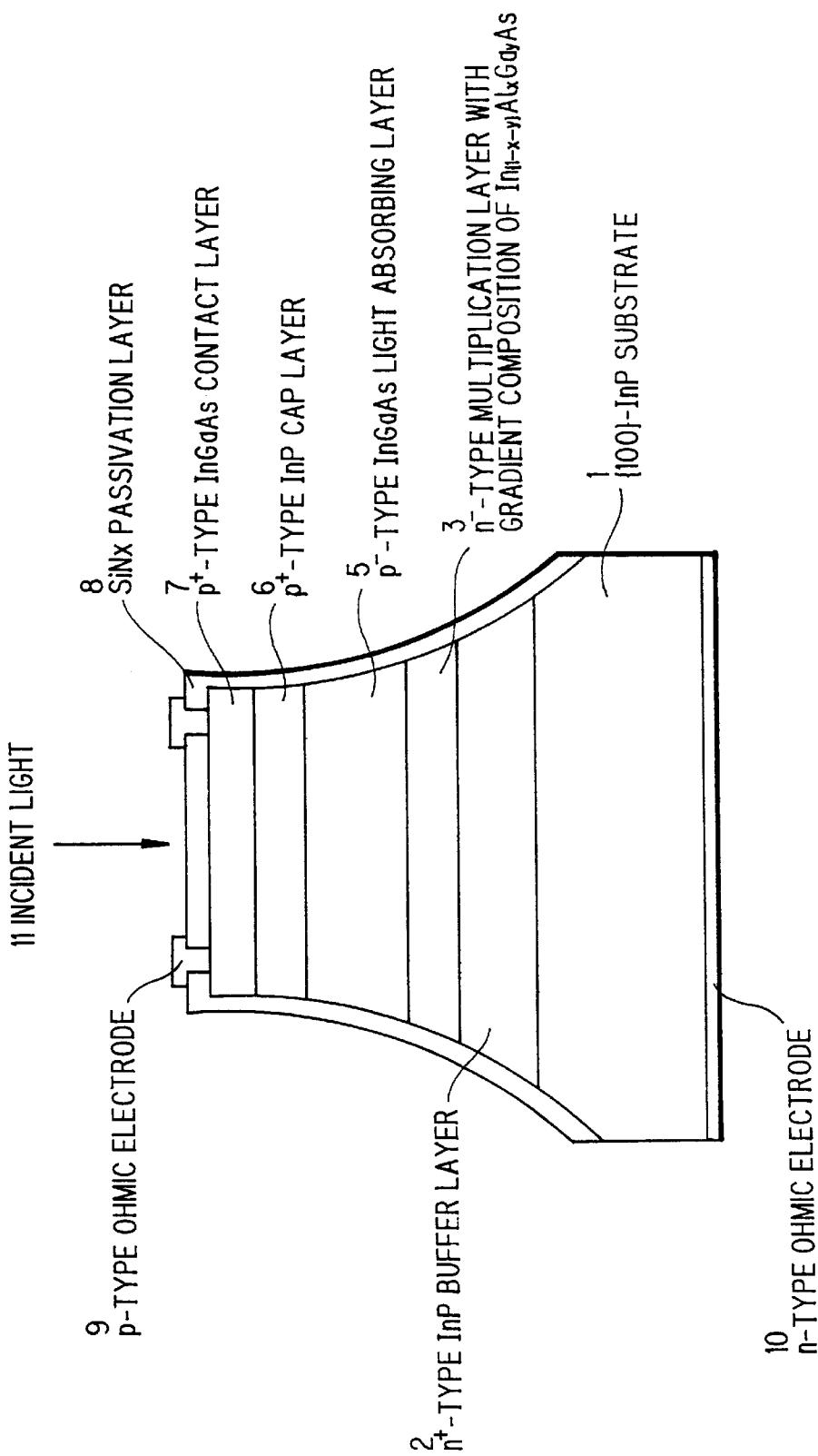
FIG. 5 is a diagram illustrating a preferred embodiment of the invention.

A preferred embodiment of the invention will be explained in detail in FIG. 5. FIG. 5 is a cross-sectional view of an avalanche multiplication type photodetector according to the preferred embodiment of the invention. This avalanche multiplication type photodetector comprises: a (100)-InP substrate 1; and, provided on the InP substrate 1 in the following order, a 0.5 μm-thick n⁺-type InP buffer layer 2 (n=7×10¹⁷ cm⁻³), a 40 nm-thick non-doped n⁻-type multiplication layer 3 (n=2×10¹⁵ cm⁻³) of $In_{(1-x-y)}Al_xGa_yAs$ with the composition thereof being graded, a 0.9 μm-thick p-type InGaAs light absorbing layer 5 (p=2×10¹⁵ cm⁻³), a 0.2 μm-thick p⁺-type InP cap layer 6 (p=1×10¹⁸ cm⁻³), and a 0.2 μm-thick p⁺-type InGaAs contact layer 7 (p=5×10¹⁸ cm⁻³). In this case, the multiplication layer 3 having a graded composition is characterized in that the composition is graded from InAlAs on the light absorbing layer side to InGaAs on the n⁺-type InP buffer layer side. In order to prevent the quantum efficiency from being lowered, the InGaAs contact layer in its light incident portion (other than a portion just under an electrode) is removed, and a 150 nm-thick SiNx layer 8 as a passivation layer is deposited, followed by provision of a 150 nm-thick p electrode 9 of AuZn by deposition. Further, an n electrode 10 is provided on the InP substrate in its side remote from the buffer layer 2. The n electrode 10 may be formed by deposition of 150 nm-thick AuGe/Ni and 50 nm-thick TiPtAu. In this APD, incident light 11 enters in a direction indicated by an arrow.

The APD having the above structure is an avalanche multiplication type semiconductor photodetector that, by virtue of the function described above, can increase impact ionization of electrons and can provide an effective ionization coefficient ratio (α/β ratio) of 100, a maximum band of 20 GHz, a gain bandwidth product of 250 GHz, and a quantum efficiency of 70%, that is, has low-noise and ultraspeed response characteristics. Specific examples of crystal growth techniques, which can realize the APD structure according to this preferred embodiment, include MOVPE, MBE, and GS-MBE. Although the APD structure has been explained with reference to a surface incidence type APD, the effect of the invention can be realized also in a backside incidence type APD and a waveguide type APD.

Figure 6:
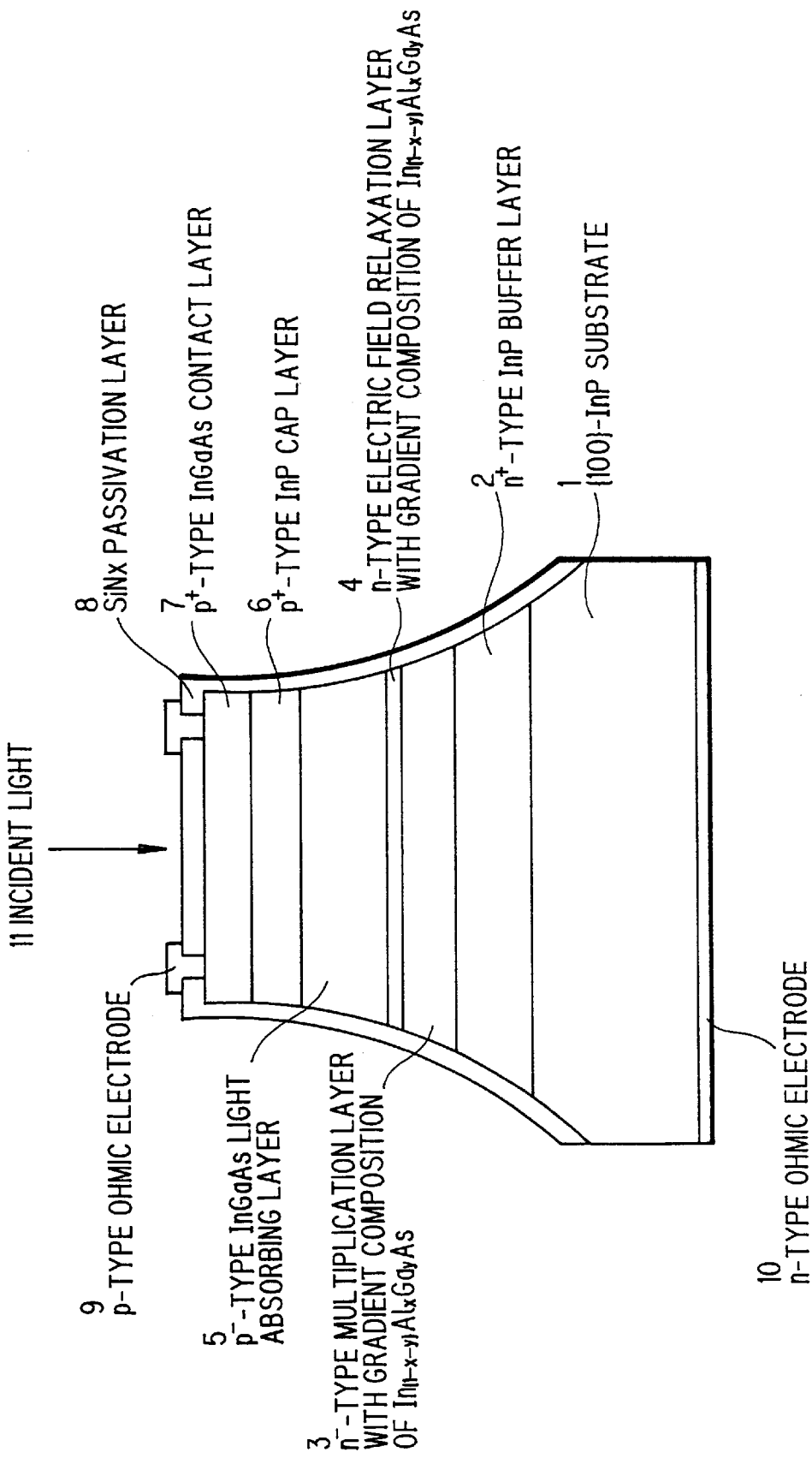
FIG. 6 is a diagram illustrating another preferred embodiment of the invention.

Another preferred embodiment of the invention will be explained in detail in FIG. 6. FIG. 6 is a cross-sectional view of an avalanche multiplication type photodetector according to the another preferred embodiment of the invention. This avalanche multiplication type photodetector comprises: a (100)-InP substrate 1; and, provided on the InP substrate 1 in the following order, a 0.5 μm-thick n⁺-type InP buffer layer 2 (n=7×10¹⁷ cm⁻³), a40 nm-thick non-doped n⁻-type multiplication layer 3 (n=2×10¹⁵ cm⁻³) of $In_{(1-x-y)}Al_xGa_yAs$ with the composition thereof being graded, a 5 nm-thick p-type electric field relaxation layer 4 (p=1×10¹⁶ cm⁻³) of $In_{(1-x-y)}Al_xGa_yAs$ with the composition thereof being graded, a 0.9 μm-thick p⁻-type InGaAs light absorbing layer 5 (p=2×10¹⁵ cm⁻³), a 0.2 μm-thick p⁺-type InP cap layer 6 (p=1×10¹⁸ cm⁻³), and a 0.2 μm-thick p⁺-type InGaAs contact layer 7 (p=5×10¹⁸ cm⁻³).

In this case, the multiplication layer 3 having a graded composition is characterized in that the composition is graded from InAlAs on the electric field relaxation layer side to InGaAs on the n⁺-type InP buffer layer. The electric field relaxation layer having a graded composition is characterized in that the composition is graded from InGaAs on the light absorbing layer side to InAlAs on the multiplication layer side. In order to prevent the quantum efficiency from being lowered, the InGaAs contact layer in its light incident portion (other than a portion just under an electrode) is removed, and a 150 nm-thick SiNx layer 8 as a passivation layer is deposited, followed by provision of a 150 nm-thick p electrode 9 of AuZn by deposition. Further, an n electrode 10 is provided on the InP substrate in its side remote from the buffer layer 2. The n electrode 10 may be formed by deposition of 150 nm-thick AuGe/Ni and 50 nm-thick TiPtAu. In this APD, incident light 11 enters in a direction indicated by an arrow.

The APD having the above structure is an avalanche multiplication type semiconductor photodetector that, by virtue of the function described above, can increase impact ionization of electrons and can provide an effective ionization coefficient ratio (α/β ratio) of 100, a maximum band of 20 GHz, a gain bandwidth product of 300 GHz, and a quantum efficiency of 70%, that is, has low-noise and ultraspeed response characteristics. Specific examples of crystal growth techniques, which can realize the APD structure according to this preferred embodiment of the invention, include MOVPE, MBE, and GS-MBE. Although the APD structure according to this preferred embodiment has been explained with reference to a surface incidence type APD, the effect of the invention can be realized also in a backside incidence type APD and a waveguide type APD.

Figure 7:
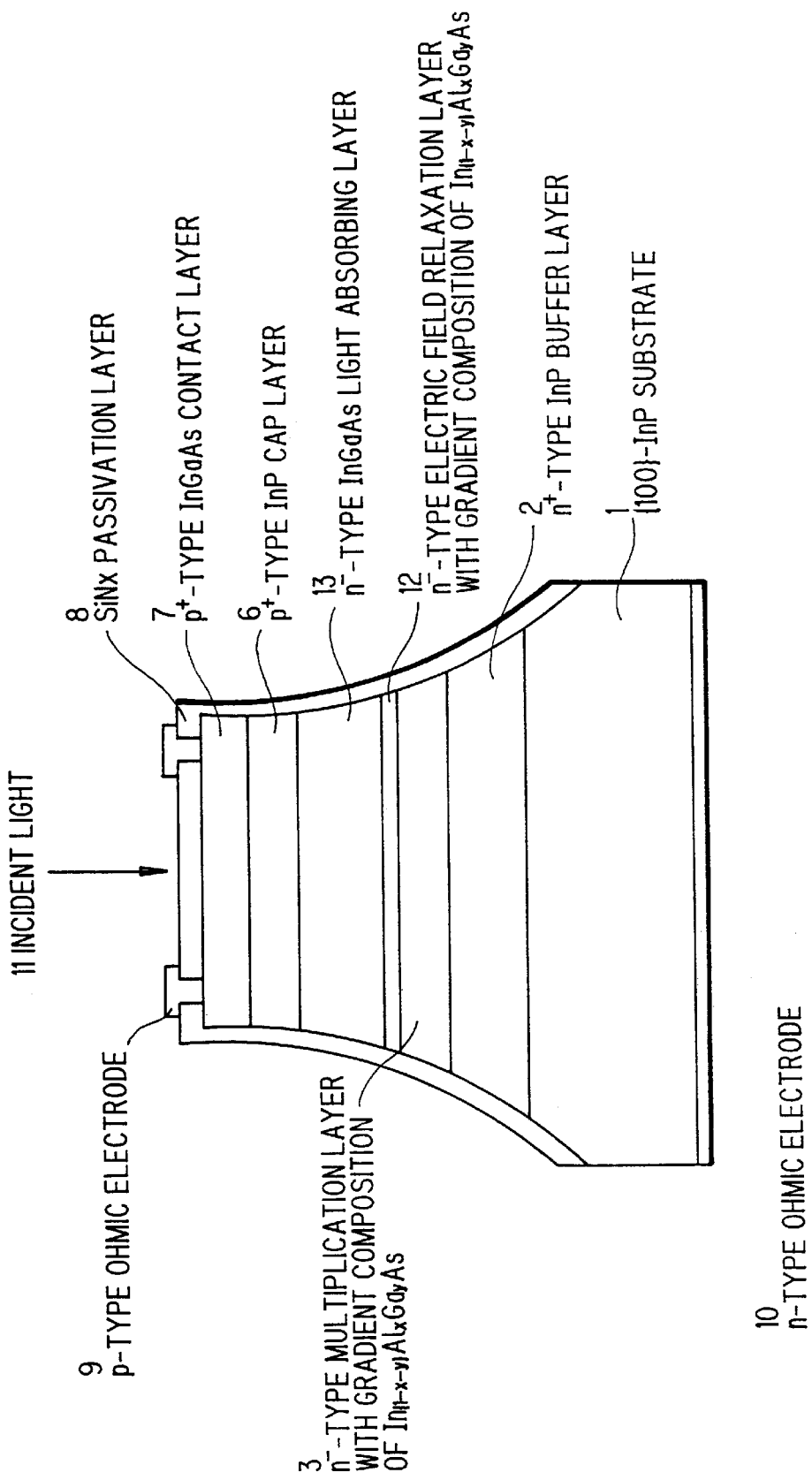
FIG. 7 is a diagram illustrating a further preferred embodiment of the invention.

A further preferred embodiment of the invention will be explained in detail in FIG. 7. FIG. 7 is a cross-sectional view of an avalanche multiplication type photodetector according to the another preferred embodiment of the invention. This avalanche multiplication type photodetector comprises: a (100)-InP substrate 1; and, provided on the InP substrate 1 in the following order, a 0.5 μm-thick n⁺-type InP buffer layer 2 (n=7×10¹⁷ cm⁻³), a 40 nm-thick non-doped n⁻-type multiplication layer 3 (n=2×10¹⁵ cm⁻³) of $In_{(1-x-y)}Al_xGa_yAs$ with the composition thereof being graded, a 5 nm-thick non-doped n⁻-type electric field relaxation layer 12 (n=2×10¹⁵ cm⁻³) of $In_{(1-x-y)}Al_xGa_yAs$ with the composition thereof being graded, a 0.9 μm-thick non-doped n⁻-type InGaAs light absorbing layer 13 (n=1×10¹⁵ cm⁻³), a 0.2 μm-thick p⁺-type InP cap layer 6 (p=1×10⁸ cm⁻³), and a 0.2 μm-thick p-type InGaAs contact layer 7 (p=5×10¹⁸ cm⁻³).

In this case, the multiplication layer 3 having a graded composition is characterized in that the composition is graded from InAlAs on the electric field relaxation layer side to InGaAs on the n⁺-type InP buffer layer. The electric field relaxation layer having a graded composition is characterized in that the composition is graded from InGaAs on the light absorbing layer side to InAlAs on the multiplication layer side. In order to prevent the quantum efficiency from being lowered, the InGaAs contact layer in its light incident portion (other than a portion just under an electrode) is removed, and a 150 nm-thick SiNx layer 8 as a passivation layer is deposited, followed by provision of a 150 nm-thick p electrode 9 of AuZn by deposition. Further, an n electrode 10 is provided on the InP substrate in its side remote from the buffer layer 2. The n electrode 10 may be formed by deposition of 150 nm-thick AuGe/Ni and 50 nm-thick TiPtAu. In this APD, incident light 11 enters in a direction indicated by an arrow.

The APD having the above structure is an avalanche multiplication type semiconductor photodetector that, by virtue of the function described above, can increase impact ionization of electrons and can provide an effective ionization coefficient ratio (α/β ratio) of 100, a maximum band of 30 GHz, a gain bandwidth product of 200 GHz, and a quantum efficiency of 70%, that is, has low-noise and ultraspeed response characteristics. Specific examples of crystal growth techniques, which can realize the APD structure according to this preferred embodiment of the invention, include MOVPE, MBE, and GS-MBE. Although the APD structure according to this preferred embodiment has been explained with reference to a surface incidence type APD, the effect of the invention can be realized also in a backside incidence type APD and a waveguide type APD.

As is apparent from the foregoing description, according to the present invention, a semiconductor photodetector at 1 μm wavelength for long distance optional communications can be provided which possesses very low noise characteristics and, in addition, ultraspeed characteristics.

The invention has been described in detail with particular reference to preferred embodiments, but it will be understood that variations and modifications can be effected within the scope of the invention as set forth in the appended claims.

What is claimed is:

1. An avalanche multiplication type semiconductor photodetector, comprising:

a semiconductor substrate; and at least one light absorbing layer and a single continuous multiplication layer disposed upon said semiconductor substrate, wherein the light absorbing layer comprises InGaAs, the multiplication layer comprises $In_{(1-x-y)}Al_xGa_yAs$ with the composition thereof being graded so that an energy band value is essentially continuously decreased from the light absorbing layer side through the multiplication layer to the multiplication layer side remote from the light absorbing layer, wherein the multiplication layer has a thickness of not more than approximately 0.1 μm.

2. An avalanche multiplication type semiconductor photodetector, comprising:

a semiconductor substrate; and at least one light absorbing layer and a single continuous multiplication layer disposed upon said semiconductor substrate, wherein the light absorbing layer comprises InGaAs, the multiplication layer comprises $In_{(1-x-y)}Al_xGa_yAs$ with the composition thereof being graded so that an energy band value is essentially continuously decreased from the light absorbing layer side through the multiplication layer to the multiplication layer side remote from the light absorbing layer, wherein an electric field relaxation layer of $In_{(1-x-y)}Al_xGa_yAs$ is interposed between the light absorbing layer and the multiplication layer.

3. An avalanche multiplication type semiconductor photodetector comprising:

a semiconductor substrate; and at least a light absorbing layer and a multiplication layer provided on said semiconductor substrate, the light absorbing layer comprising InGaAs, the multiplication layer comprising $In_{(1-x-y)}Al_xGa_yAs$ with the composition thereof being graded so that the energy band is continuously decreased from the light absorbing layer side toward the multiplication layer in its side remote from the light absorbing layer;

wherein the composition of the multiplication layer is graded from InAlAs to InGaAs;

wherein the multiplication layer has a thickness of not more than 0.1 μm;

wherein an electric field relaxation layer of $In_{(1-x-y)}Al_xGa_yAs$ is interposed between the light absorbing layer and the multiplication layer; and wherein the composition of the electric field relaxation layer is grade from InGaAs on the light absorbing side to InAlAs on the multiplication layer side so as to continuously increase the energy band.

4. The semiconductor photodetector according to claim 2, wherein the light absorbing layer is of p-conductive type, the electric field relaxation layer is of p-conductive type, and the multiplication layer is n-conductive type or a high-resistance layer (i-conductive type).

5. The semiconductor photodetector according to claim 2, wherein all the light absorbing layer, the electric field relaxation layer, and the multiplication layer are of n-conductive type or a high-resistance layer (i-conductive type).

6. The semiconductor photodetector according to claim 3, wherein the light absorbing layer is of p-conductive type, the electric field relaxation layer is of p-conductive type, and the multiplication layer is n-conductive type or a high-resistance layer (i-conductive type).

7. The semiconductor photodetector according to claim 3, wherein all the light absorbing layer, the electric field relaxation layer, and the multiplication layer are of n-conductive type or a high-resistance layer (i-conductive type).

8. The semiconductor photodetector according to claim 1, wherein an electric field relaxation layer of $In_{(1-x-y)}Al_xGa_yAs$ is interposed between the light absorbing layer and the multiplication layer.

9. An avalanche multiplication type semiconductor photodetector, comprising:

a semiconductor substrate; and at least one light absorbing layer and a single continuous multiplication layer disposed upon said semiconductor, wherein the light absorbing layer comprises InGaAs, the multiplication layer comprises $In_{(1-x-y)}Al_xGa_yAs$ with the composition thereof being graded so that an energy band value is essentially continuously decreased from the light absorbing layer side through the multiplication layer to the multiplication layer side remote from the light absorbing layer, wherein the composition of the multiplication layer is graded from InAlAs to InGaAs from the absorbing layer to the multiplication layer side remote from the light absorbing layer, wherein an electric field relaxation layer of $In_{(1-x-y)}Al_xGa_yAs$ is interposed between the light absorbing layer and the multiplication layer.

* * * * *